(12) United States Patent
Huang et al.

(10) Patent No.: US 12,021,129 B2
(45) Date of Patent: Jun. 25, 2024

(54) WORK FUNCTION METAL GATE DEVICE

(71) Applicant: UNITED MICROELECTRONICS CORP., Hsin-Chu (TW)

(72) Inventors: Chih-Wen Huang, Tainan (TW); Shih-An Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 33 days.

(21) Appl. No.: 17/945,122

(22) Filed: Sep. 15, 2022

(65) Prior Publication Data

US 2023/0014945 A1 Jan. 19, 2023

Related U.S. Application Data

(62) Division of application No. 17/128,168, filed on Dec. 20, 2020, now Pat. No. 11,482,605.

(30) Foreign Application Priority Data

Nov. 10, 2020 (CN) .......................... 202011244345.3

(51) Int. Cl.
| | |
|---|---|
| H01L 29/76 | (2006.01) |
| H01L 21/28 | (2006.01) |
| H01L 29/06 | (2006.01) |
| H01L 29/10 | (2006.01) |
| H01L 29/423 | (2006.01) |
| H01L 29/49 | (2006.01) |
| H01L 29/66 | (2006.01) |
| H01L 29/78 | (2006.01) |
| H01L 29/94 | (2006.01) |
| H01L 31/113 | (2006.01) |

(52) U.S. Cl.
CPC .. *H01L 29/42376* (2013.01); *H01L 21/28088* (2013.01); *H01L 21/28114* (2013.01); *H01L 29/0653* (2013.01); *H01L 29/1095* (2013.01); *H01L 29/4966* (2013.01); *H01L 29/66681* (2013.01); *H01L 29/7816* (2013.01)

(58) Field of Classification Search
CPC ......... H01L 29/42376; H01L 21/28088; H01L 21/28114; H01L 29/0653; H01L 29/1095; H01L 29/4966; H01L 29/66681; H01L 29/7816; H01L 29/4983; H01L 29/513; H01L 29/517; H01L 29/66568; H01L 29/7836; H01L 21/28105; H01L 29/4238
USPC ......................................................... 257/343
See application file for complete search history.

(56) References Cited

U.S. PATENT DOCUMENTS

| | | | |
|---|---|---|---|
| 9,583,362 B2 | 2/2017 | Ho et al. | |
| 10,192,969 B2 | 1/2019 | Jan | |
| 2010/0283107 A1 | 11/2010 | Muller | |
| 2012/0086085 A1* | 4/2012 | Hsu | H01L 21/823842 257/369 |

(Continued)

*Primary Examiner* — Theresa T Doan
(74) *Attorney, Agent, or Firm* — Winston Hsu

(57) ABSTRACT

A work function metal gate device includes a gate, a drift region, a source, a drain and a first isolation structure. The gate includes a convex stair-shaped work function metal stack or a concave stair-shaped work function metal stack disposed on a substrate. The drift region is disposed in the substrate below a part of the gate. The source is located in the substrate and the drain is located in the drift region beside the gate. The first isolation structure is disposed in the drift region between the gate and the drain.

8 Claims, 5 Drawing Sheets

(56) References Cited

U.S. PATENT DOCUMENTS

2012/0175703 A1\* 7/2012 Park ................... H01L 29/7835
257/E29.256

\* cited by examiner

WORK FUNCTION METAL GATE DEVICE

CROSS REFERENCE TO RELATED APPLICATIONS

This application is a division of U.S. application Ser. No. 17/128,168, filed on Dec. 20, 2020. The content of the application is incorporated herein by reference.

BACKGROUND OF THE INVENTION

1. Field of the Invention

The present invention relates generally to a work function metal gate device, and more specifically to a work function metal gate device including a stair-shaped work function metal stack.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as lower performances due to boron penetration and unavoidable depletion effect. This increases the equivalent thickness of the gate dielectric layer, reduces gate capacitance, and weakens a driving force of the devices. Therefore, work function metals that are suitable to be used as high-K gate dielectric layers are used to replace the conventional poly-silicon gates to serve as control electrodes.

SUMMARY OF THE INVENTION

The present invention provides a work function metal gate device, which includes a gate having a stair-shaped work function metal stack to tune charge densities in channels and reduce resistance.

The present invention provides a work function metal gate device including a gate, a drift region, a source, a drain and a first isolation structure. The gate including a concave stair-shaped work function metal stack is disposed on a substrate. The drift region is disposed in the substrate below a part of the gate. The source is located in the substrate and the drain is located in the drift region beside the gate. The first isolation structure is disposed in the drift region between the gate and the drain.

According to the above, the present invention provides a work function metal gate device, which includes a gate on a substrate, wherein the gate includes a concave stair-shaped work function metal stack, to change charge densities in channels, and to reduce the resistance in the substrate between a source and a drain.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
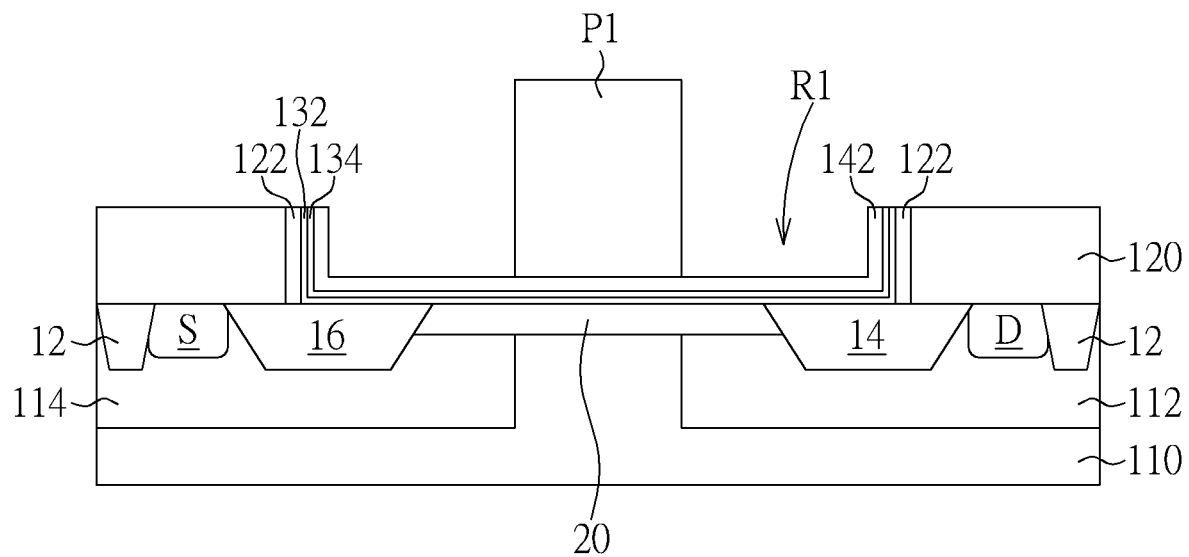
FIG. 1 schematically depicts a cross-sectional view of a method of forming a work function metal gate device according to an embodiment of the present invention.

FIGS. 1-5 schematically depict cross-sectional views of a method of forming a work function metal gate device according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, a drift region 112 and a first drift region 114 may be doped in the substrate 110 by implanting. Isolation structures 12 are formed in the substrate 110 to electrically isolate each transistor, and a first isolation structure 14 and a second isolation structure 16 are formed in the substrate 110 to electrically isolate a gate, a drain and a source of a high voltage transistor. The isolation structures 12, the first isolation structure 14 and the second isolation structure 16 may be shallow trench isolation (STI) structures, which may be formed by a shallow trench isolation process, and the forming method is known in the art, and will not be described herein, but it is not limited thereto. The isolation structure 12 and the first isolation structure 14 are located in the drift region 112, and the other isolation structure 12 and the second isolation structure 16 are located in the first drift region 114, but it is not limited thereto.

A gate oxide layer 20 may be selectively formed in the substrate 110 between the first isolation structure 14 and the second isolation structure 16. Then, a metal gate is formed on the gate oxide layer 20, the first isolation structure 14 and the second isolation structure 16.

More precisely, an interlayer dielectric layer 120 is deposited to cover the substrate 110, wherein the interlayer dielectric layer 120 has a recess R1. Methods of forming the interlayer dielectric layer 120 may include the following steps. A sacrificial gate (not shown) is formed on the gate oxide layer 20, the first isolation structure 14 and the second isolation structure 16, and then a drain D is formed in the drift region 112 between the isolation structure 12 and the first isolation structure 14, and a source S is formed in the first drift region 114 between the isolation structure 12 and the second isolation structure 16. An interlayer dielectric layer (not shown) is deposited on the substrate 110 beside the sacrificial gate blanketly, and then the sacrificial gate is removed to form recess R1 in the interlayer dielectric layer 120. Moreover, spacers 122 may be optionally formed beside the sacrificial gate before the interlayer dielectric layer is deposited. Therefore, after the sacrificial gate is removed, the spacers 122 surround the recess R1.

Thereafter, a U-shaped dielectric layer having a high dielectric constant 132, a U-shaped barrier layer 134 and a first work function metal layer 142 are formed to conformally cover the recess R1. In one case, a dielectric layer having a high dielectric constant (not shown), a barrier layer (not shown) and a work function metal layer (not shown) are deposited sequentially to conformally cover the recess R1, the spacers 122 and the interlayer dielectric layer 120, and then the dielectric layer having a high dielectric constant (not shown), the barrier layer (not shown) and the work function metal layer (not shown) exceeding from the recess R1 are removed to form the U-shaped dielectric layer having a high dielectric constant 132, the U-shaped barrier layer 134 and the first work function metal layer 142 in the recess R1. The U-shaped dielectric layer having a high dielectric constant 132 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST); the U-shaped barrier layer 134 may be a single layer or a multilayer composed of tantalum nitride (TaN) or titanium nitride (TiN), but it is not limited thereto.

A photoresist P1 is formed on the first work function metal layer 142 to pattern the first work function metal layer 142.

Figure 2:
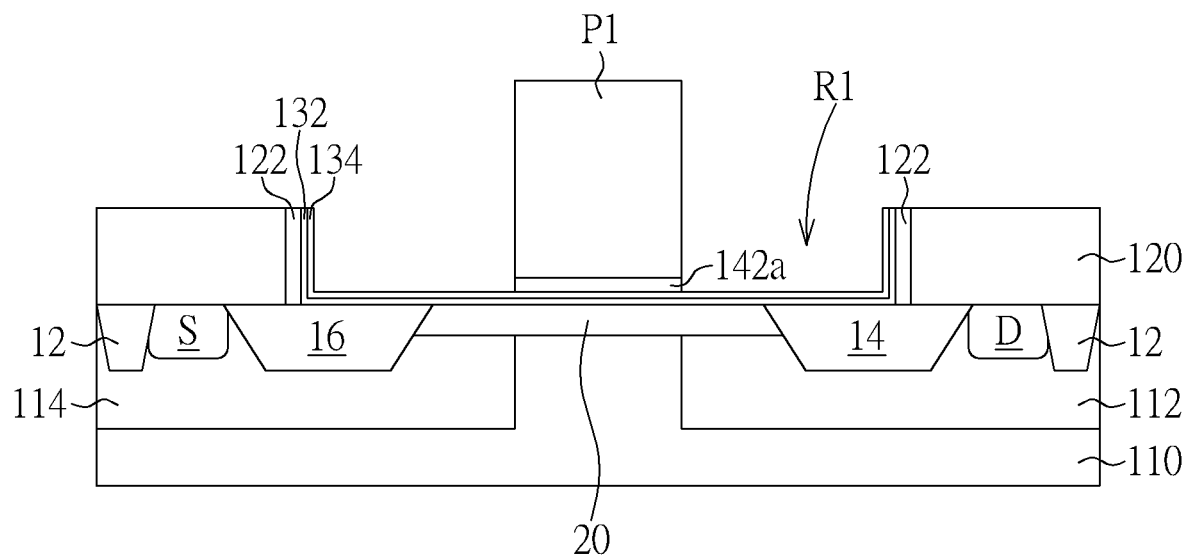
FIG. 2 schematically depicts a cross-sectional view of a method of forming a work function metal gate device according to an embodiment of the present invention.

As shown in FIG. 2, the first work function metal layer 142 is patterned by the photoresist P1 to form a first work function metal layer 142a, and the photoresist P1 is then removed.

Figure 3:
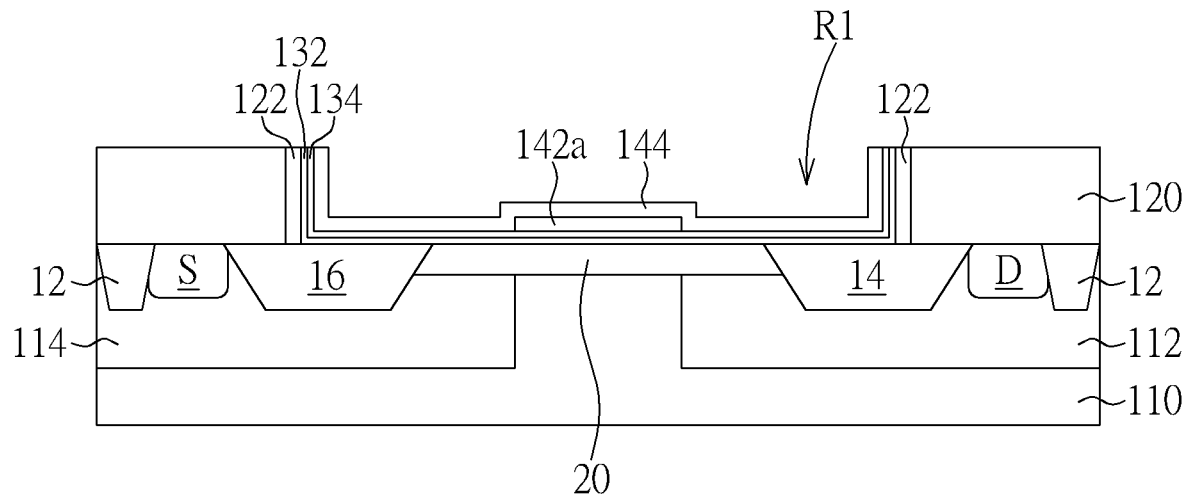
FIG. 3 schematically depicts a cross-sectional view of a method of forming a work function metal gate device according to an embodiment of the present invention.
Figure 4:
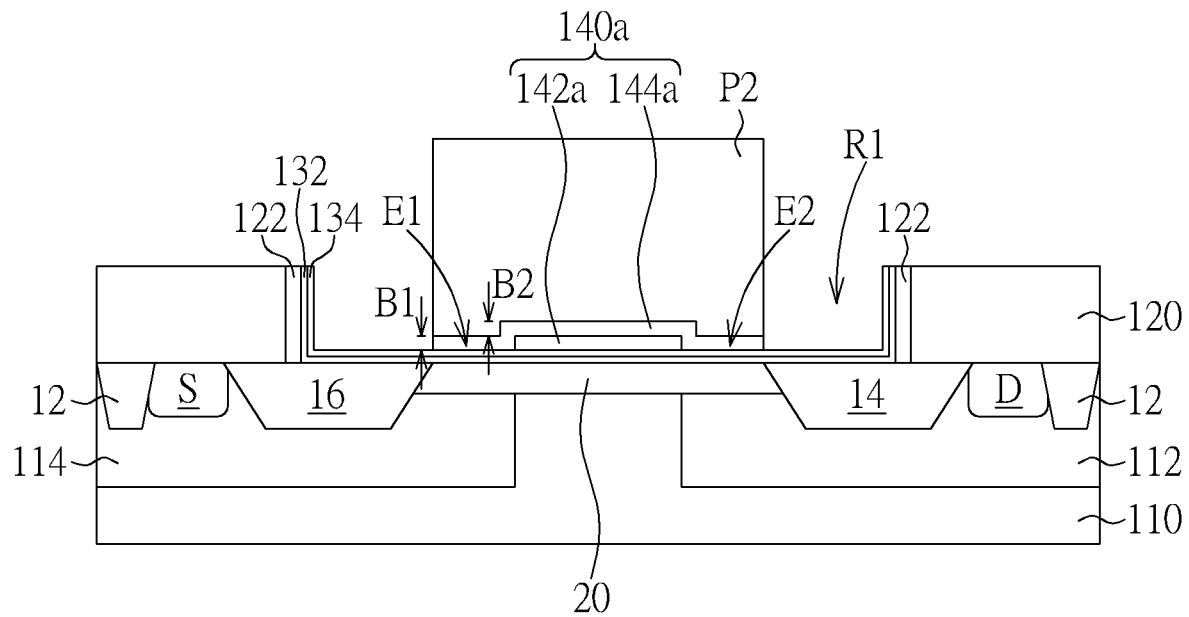
FIG. 4 schematically depicts a cross-sectional view of a method of forming a work function metal gate device according to an embodiment of the present invention.

Please refer to FIGS. 3-4, a second work function metal layer 144a is formed to cover the first work function metal layer 142a. As shown in FIG. 3, a second work function metal layer 144 is deposited to conformally cover the recess R1. As shown in FIG. 4, a photoresist P2 is formed to cover a part of the second work function metal layer 144 in the recess R1, and the second work function metal layer 144 is patterned, thereby the second work function metal layer 144a covering the first work function metal layer 142a being formed. The photoresist P2 is then removed.

In this way, a first stair-shaped work function metal stack 140a including a bottom work function metal layer B1 and a top work function metal layer B2 can be formed, wherein two ends E1/E2 of the bottom work function metal layer B1 protrude from the top work function metal layer B2. In this case, the first work function metal layer 142a and the second work function metal layer 144a are deposited respectively to form the first stair-shaped work function metal stack 140a. In another case, the first stair-shaped work function metal stack 140a may be formed by depositing the bottom work function metal layer B1 and the top work function metal layer B2 respectively.

Figure 5:
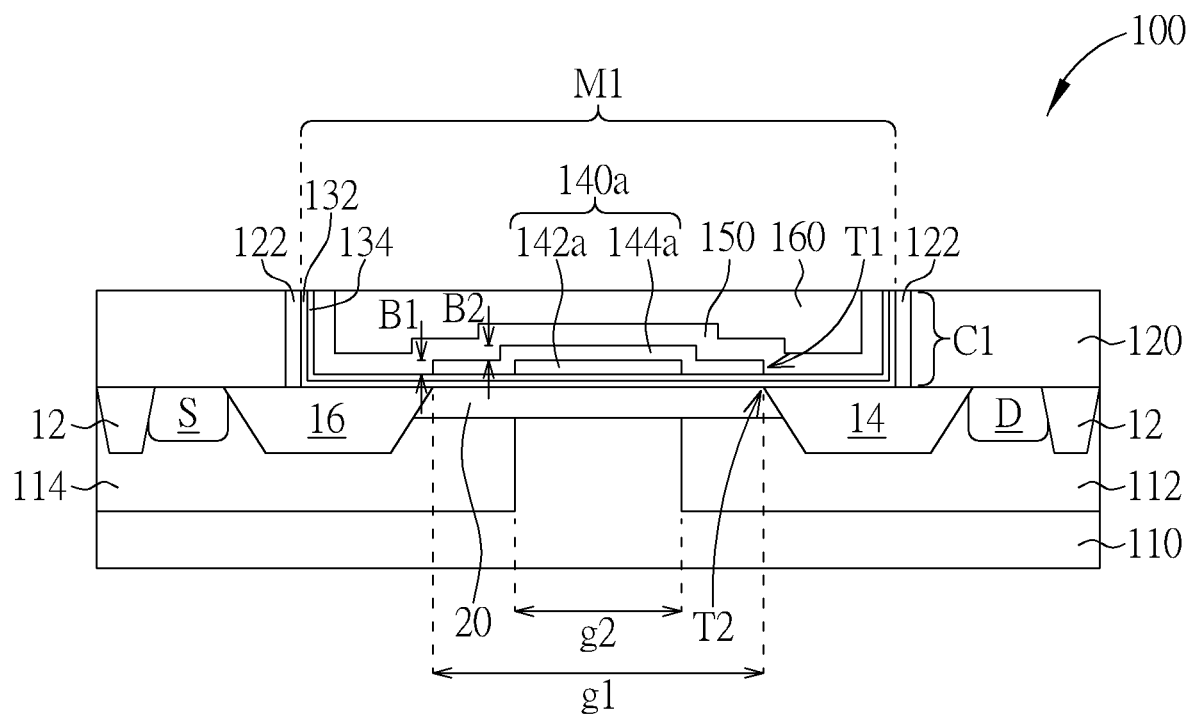
FIG. 5 schematically depicts a cross-sectional view of a method of forming a work function metal gate device according to an embodiment of the present invention.

As shown in FIG. 5, a second stair-shaped work function metal stack 150 is deposited to conformally cover the first stair-shaped work function metal stack 140a and the substrate 110. The first stair-shaped work function metal stack 140a and the second stair-shaped work function metal stack 150 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc. Thereby, a convex stair-shaped work function metal stack C1 can be formed. Preferably, the convex stair-shaped work function metal stack C1 has a pyramid stair-shaped cross-sectional profile, but it is not restricted thereto.

In this embodiment, the conductive type of the first stair-shaped work function metal stack 140a is different from the conductive type of the second stair-shaped work function metal stack 150. In this embodiment, the first stair-shaped work function metal stack 140a may be a titanium nitride layer suited for forming a PMOS transistor (the work function value is between the range of 4.8 eV and 5.2 eV), and the second stair-shaped work function metal stack 150 may be an aluminum titanium layer suited for forming a NMOS transistor (the work function value is between the range of 3.9 eV and 4.3 eV), but it is not limited thereto.

A low resistivity material 160 fills into the recess R1, to form a (metal) gate M1, wherein the low resistivity material 160 may be composed of low resistivity materials such as aluminum, tungsten, titanium aluminum (TiAl) alloy, cobalt tungsten phosphide (CoWP) or etc.

A work function metal gate device 100 is carried out in this embodiment, wherein the work function metal gate device 100 includes the gate M1 disposed on the substrate 110, and the gate M1 includes the convex stair-shaped work function metal stack C1. The convex stair-shaped work function metal stack C1 may include the bottom work function metal layer B1 and the top work function metal layer B2.

The drift region 112 is disposed in the substrate 110 below apart of the gate M1, and the first isolation structure 14 is disposed in the drift region 112 between the gate M1 and the drain D. The first drift region 114 is disposed in the substrate 110 below a part of the gate M1, and the second isolation structure 16 is disposed in the first drift region 114 between the gate M1 and the source S. Hence, charge densities in channels can be adjusted and the resistance of the substrate is reduced. In a preferred embodiment, the first stair-shaped work function metal stack 140a vertically overlaps a part of the first isolation structure 14, or a sidewall T1 of the first stair-shaped work function metal stack 140a is aligned with a sidewall T2 of the first isolation structure 14. In a still preferred embodiment, the bottom work function metal layer B1 vertically overlaps a gap g1 between the first isolation structure 14 and the second isolation structure 16, and the top work function metal layer B2 vertically overlaps a gap g2 between the drift region 112 and the first drift region 114.

Above all, a work function metal gate device including a convex stair-shaped work function metal stack is presented. A work function metal gate device including a concave stair-shaped work function metal stack is provided as follows.

Figure 6:
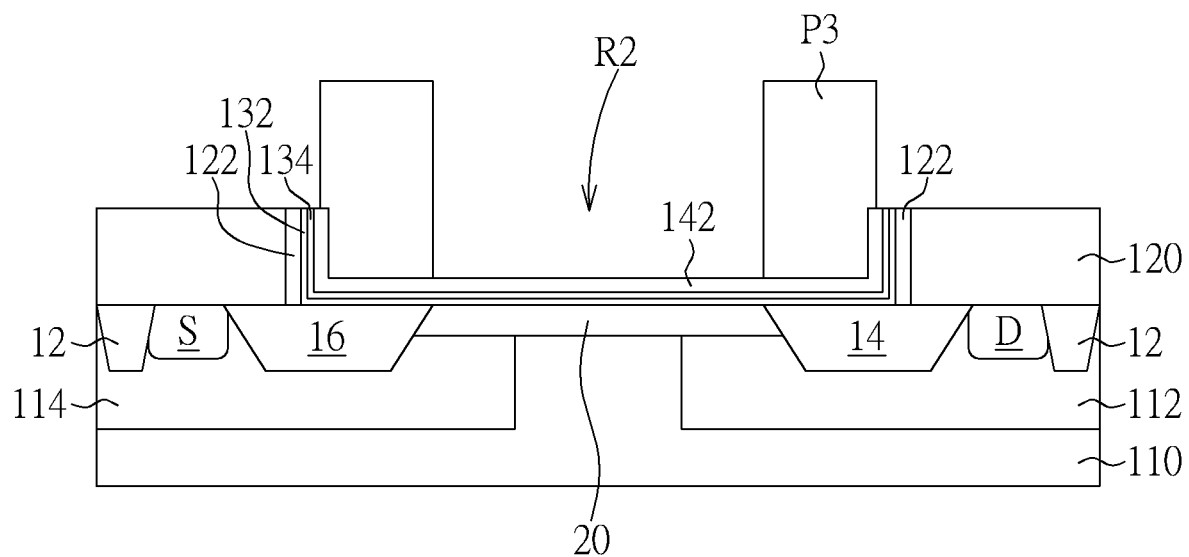
FIG. 6 schematically depicts a cross-sectional view of a method of forming a work function metal gate device according to another embodiment of the present invention.

FIGS. 6-10 schematically depict cross-sectional views of a method of forming a work function metal gate device according to another embodiment of the present invention. As shown in FIG. 6, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, a drift region 112 and a first drift region 114 may be doped in the substrate 110 by implanting. Isolation structures 12 are formed in the substrate 110 to electrically isolate each transistor, and a first isolation structure 14 and a second isolation structure 16 are formed in the substrate 110 to electrically isolate a gate, a drain and a source of a high voltage transistor. The isolation structures 12, the first isolation structure 14 and the second isolation structure 16 may be shallow trench isolation (STI) structures, which may be formed by a shallow trench isolation process, and the forming method is known in the art, and will not be described herein, but it is not limited thereto. The isolation structures 12 and the first isolation structure 14 are located in the drift region 112, and the isolation structures 12 and the second isolation structure 16 are located in the first drift region 114, but it is not limited thereto.

A gate oxide layer 20 may be selectively formed in the substrate 110 between the first isolation structure 14 and the second isolation structure 16. Then, a metal gate is formed on the gate oxide layer 20, the first isolation structure 14 and the second isolation structure 16. More precisely, an interlayer dielectric layer 120 is deposited to cover the substrate 110, wherein the interlayer dielectric layer 120 has a recess R2. Methods of forming the interlayer dielectric layer 120 may include the following steps. A sacrificial gate (not shown) is formed on the gate oxide layer 20, the first isolation structure 14 and the second isolation structure 16, and then a drain D is formed in the drift region 112 between the isolation structure 12 and the first isolation structure 14, and a source S is formed in the first drift region 114 between the isolation structure 12 and the second isolation structure 16. An interlayer dielectric layer (not shown) is deposited on the substrate 110 beside the sacrificial gate blanketly, and then the sacrificial gate is removed to form recess R2 in the interlayer dielectric layer 120. Moreover, spacers 122 may be optionally formed beside the sacrificial gate before the interlayer dielectric layer is deposited. Therefore, after the sacrificial gate is removed, the spacers 122 surround the recess R2.

Thereafter, a U-shaped dielectric layer having a high dielectric constant 132, a U-shaped barrier layer 134 and a first work function metal layer 142 are formed to conformally cover the recess R2. In one case, a dielectric layer having a high dielectric constant (not shown), a barrier layer (not shown) and a work function metal layer (not shown) are deposited sequentially to conformally cover the recess R2, the spacers 122 and the interlayer dielectric layer 120, and then the dielectric layer having a high dielectric constant (not shown), the barrier layer (not shown) and the work function metal layer (not shown) exceeding from the recess R2 are removed to form the U-shaped dielectric layer having a high dielectric constant 132, the U-shaped barrier layer 134 and the first work function metal layer 142 in the recess R2. The U-shaped dielectric layer having a high dielectric constant 132 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST); the U-shaped barrier layer 134 may be a single layer or a multilayer composed of tantalum nitride (TaN) or titanium nitride (TiN), but it is not limited thereto.

A photoresist P3 is formed on the first work function metal layer 142 to pattern the first work function metal layer 142.

Figure 7:
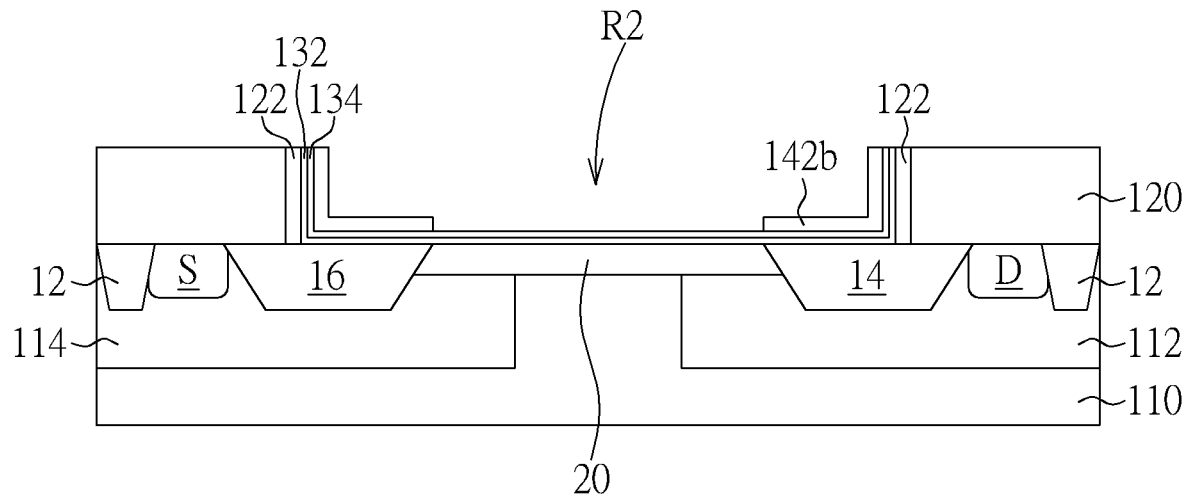
FIG. 7 schematically depicts a cross-sectional view of a method of forming a work function metal gate device according to another embodiment of the present invention.

As shown in FIG. 7, the first work function metal layer 142 is patterned by the photoresist P3 to form a first work function metal layer 142b, and thus a part of the U-shaped barrier layer 134 is exposed. The photoresist P3 is then removed.

Figure 8:
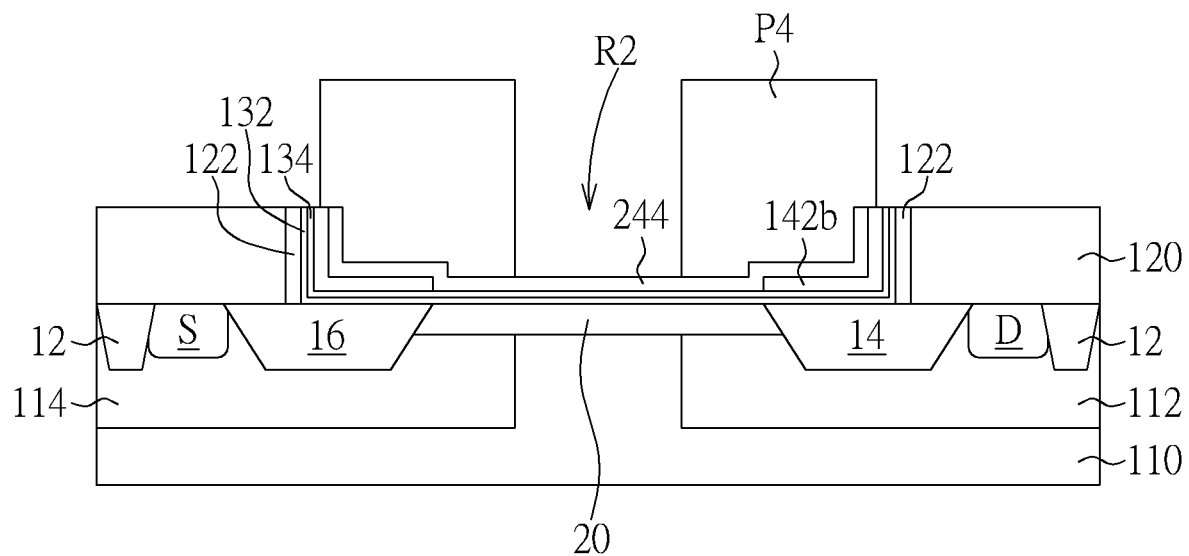
FIG. 8 schematically depicts a cross-sectional view of a method of forming a work function metal gate device according to another embodiment of the present invention.
Figure 9:
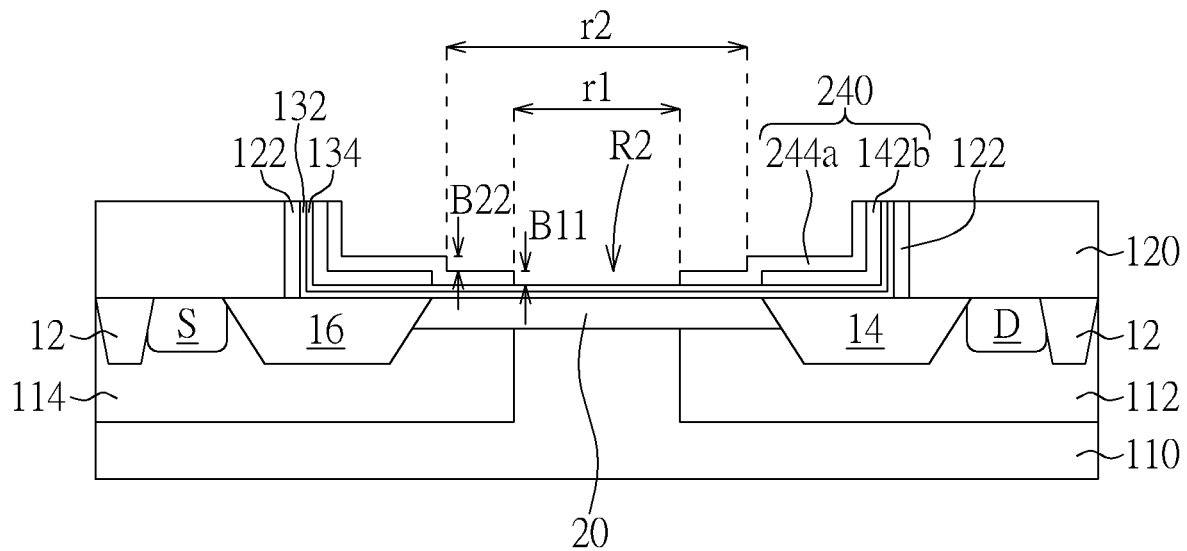
FIG. 9 schematically depicts a cross-sectional view of a method of forming a work function metal gate device according to another embodiment of the present invention.

Please refer to FIGS. 8-9, a second work function metal layer 244a is formed to cover the first work function metal layer 142b. As shown in FIG. 8, a second work function metal layer 244 is deposited to conformally cover the recess R2. As shown in FIG. 9, a photoresist P4 is formed to cover a part of the second work function metal layer 244, and the second work function metal layer 244 is patterned, thereby the second work function metal layer 244a covering the first work function metal layer 142b being formed. The photoresist P4 is then removed.

In this way, a first stair-shaped work function metal stack 240 including a bottom work function metal layer B11 and a top work function metal layer B22 can be formed. The bottom work function metal layer B11 has a first recess r1 and a top work function metal layer B22 has a second recess r2, wherein the second recess r2 vertically overlaps the first recess r1. In a preferred embodiment, the first recess r1 and the second recess r2 shares a same central line, to form a symmetric work function metal structure.

In this case, the first work function metal layer 142b and the second work function metal layer 244a are deposited respectively to form the first stair-shaped work function metal stack 240. In another case, the first stair-shaped work function metal stack 240 may be formed by depositing the bottom work function metal layer B11 and the top work function metal layer B22 respectively.

Figure 10:
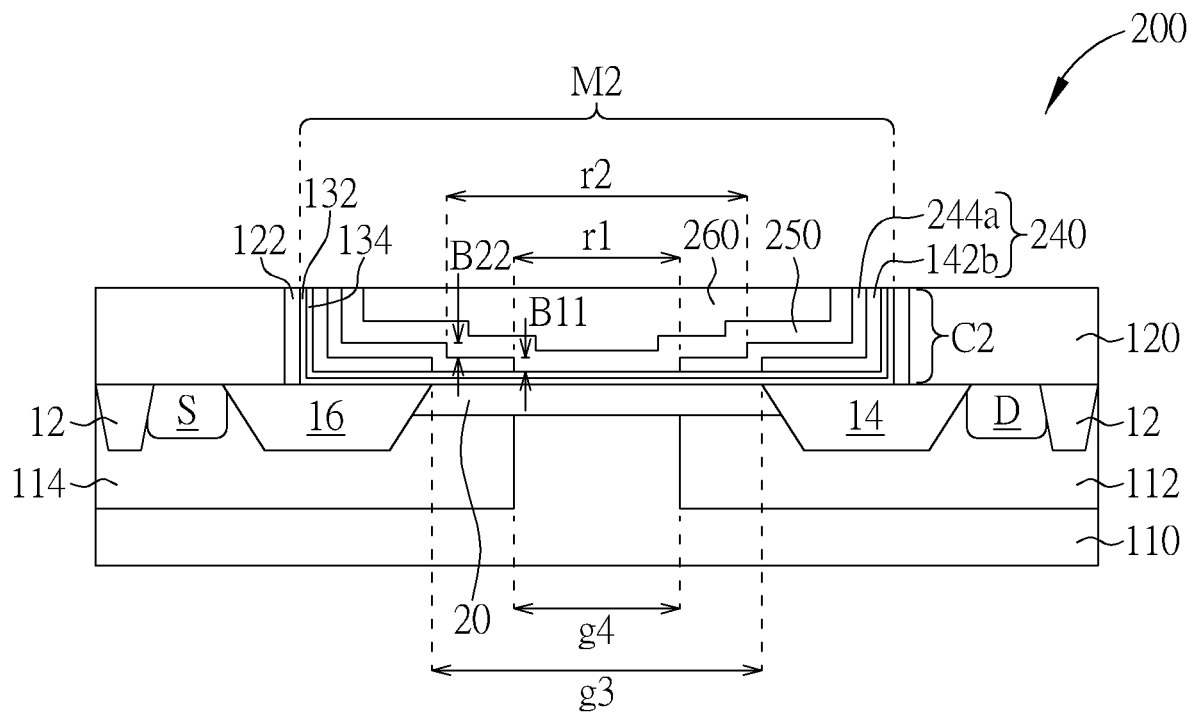
FIG. 10 schematically depicts a cross-sectional view of a method of forming a work function metal gate device according to another embodiment of the present invention.

As shown in FIG. 10, a second stair-shaped work function metal stack 250 is deposited to conformally cover the first stair-shaped work function metal stack 240 and the substrate 110. The first stair-shaped work function metal stack 240 and the second stair-shaped work function metal stack 250 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc. Thereby, a concave stair-shaped work function metal stack C2 can be formed. Preferably, the concave stair-shaped work function metal stack C2 has a plate stair-shaped cross-sectional profile, but it is not restricted thereto.

In this embodiment, the conductive type of the first stair-shaped work function metal stack 240 is different from the conductive type of the second stair-shaped work function metal stack 250. In this embodiment, the first stair-shaped work function metal stack 240 may be a titanium nitride layer suited for forming a PMOS transistor (the work function value is between the range of 4.8 eV and 5.2 eV), and the second stair-shaped work function metal stack 250 may be an aluminum titanium layer suited for forming a NMOS transistor (the work function value is between the range of 3.9 eV and 4.3 eV), but it is not limited thereto.

A low resistivity material 260 fills into the recess R2, to form a (metal) gate M2, wherein the low resistivity material 260 may be composed of low resistivity materials such as aluminum, tungsten, titanium aluminum (TiAl) alloy, cobalt tungsten phosphide (CoWP) or etc.

A work function metal gate device 200 is carried out in this embodiment, wherein the work function metal gate device 200 includes the gate M2 disposed on the substrate 110, and the gate M2 includes the concave stair-shaped work function metal stack C2. The concave stair-shaped work function metal stack C2 may include the bottom work function metal layer B11 and the top work function metal layer B22.

The drift region 112 is disposed in the substrate 110 below a part of the gate M2, and the first isolation structure 14 is disposed in the drift region 112 between the gate M2 and the drain D. The first drift region 114 is disposed in the substrate 110 below a part of the gate M2, and the second isolation structure 16 is disposed in the first drift region 114 between the gate M2 and the source S. Hence, charge densities in channels between the source S and the drain D (especially in the channels near the drain D) can be adjusted and the resistance of the substrate is reduced. In a preferred embodiment, the second recess r2 of the top work function metal layer B22 vertically overlaps a gap g3 between the first isolation structure 14 and the second isolation structure 16. In a still preferred embodiment, the first recess r1 of the bottom work function metal layer B11 vertically overlaps a gap g4 between the drift region 112 and first drift region 114.

To summarize, the present invention provides a work function metal gate device, which includes a gate on a substrate, wherein the gate includes a convex stair-shaped work function metal stack or a concave stair-shaped work function metal stack, to change charge densities in channels, and to reduce the resistance in the substrate between a source and a drain. The convex stair-shaped work function metal stack preferably has a pyramid stair-shaped cross-sectional profile. The concave stair-shaped work function metal stack preferably has a plate stair-shaped cross-sectional profile Furthermore, a drain is located in the drift region beside the gate, and a source is located in a first drift region beside the gate. A first isolation structure is disposed in the drift region between the gate and the drain, and a second isolation structure is disposed in the first drift region between the gate and the source. The relative positions of the metal layers of the stair-shaped work function metal stack vertically overlapping these drift regions and these isolation structures can be adjusted, so that local charge densities in channels can be changed, and the resistance of the substrate or the resistance of the drift region can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A work function metal gate device, comprising:
a gate comprising a concave stair-shaped work function metal stack disposed on a substrate, wherein the concave stair-shaped work function metal stack has a plate stair-shaped cross-sectional profile, and the concave stair-shaped work function metal stack comprises a first stair-shaped work function metal stack and a second stair-shaped work function metal stack conformally covering the first stair-shaped work function metal stack;
a drift region located in the substrate below a part of the gate;
a source located in the substrate and a drain located in the drift region beside the gate; and
a first isolation structure disposed in the drift region between the gate and the drain.

2. The work function metal gate device according to claim 1, wherein the conductive type of the first stair-shaped work function metal stack is different from the conductive type of the second stair-shaped work function metal stack.

3. The work function metal gate device according to claim 1, wherein the first stair-shaped work function metal stack comprises a bottom work function metal layer having a first recess and a top work function metal layer having a second recess.

4. The work function metal gate device according to claim 3, wherein the second recess vertically overlaps the first recess.

5. The work function metal gate device according to claim 4, wherein the second recess and the first recess share a same central line.

6. The work function metal gate device according to claim 5, further comprising:
a second isolation structure disposed in the substrate between the gate and the source; and
a gate oxide layer located in the substrate between the first isolation structure and the second isolation structure.

7. The work function metal gate device according to claim 6, wherein the second recess of the top work function metal layer vertically overlaps a gap between the first isolation structure and the second isolation structure.

8. The work function metal gate device according to claim 6, further comprising:
a first drift region disposed in the substrate below a part of the gate, wherein the source and the second isolation structure located in the first drift region, and wherein the first recess of the bottom work function metal layer vertically overlaps a gap between the drift region and the first drift region.

* * * * *